(12) United States Patent  
Ivanov et al.

(10) Patent No.: US 12,348,203 B2  
(45) Date of Patent: Jul. 1, 2025

(54) NONLINEAR FREQUENCY COMPENSATION SYSTEM

(71) Applicant: TEXAS INSTRUMENTS INCORPORATED, Dallas, TX (US)

(72) Inventors: Vadim Valerievich Ivanov, Dallas, TX (US); Srinivas Kumar Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 711 days.

(21) Appl. No.: 17/678,796

(22) Filed: Feb. 23, 2022

(65) Prior Publication Data

US 2023/0268897 A1    Aug. 24, 2023

(51) Int. Cl.
*H03F 3/45* (2006.01)
*H03F 1/08* (2006.01)
*H03F 1/32* (2006.01)

(52) U.S. Cl.
CPC ......... *H03F 3/45183* (2013.01); *H03F 1/086* (2013.01); *H03F 1/3211* (2013.01)

(58) Field of Classification Search
CPC ..... H03F 3/45183; H03F 1/086; H03F 1/3211
USPC .................................................. 330/253, 284
See application file for complete search history.

(56) References Cited

U.S. PATENT DOCUMENTS

| | | | | |
|---|---|---|---|---|
| 4,072,866 A * | 2/1978 | Kabat | ................... | G05D 23/24 |
| | | | | 219/486 |
| 4,110,692 A * | 8/1978 | Pradal | ................. | H04B 14/006 |
| | | | | 455/116 |
| 4,578,818 A * | 3/1986 | Claydon | ................. | H03C 3/02 |
| | | | | 327/309 |
| 4,802,236 A * | 1/1989 | Walczak | ................. | H03C 3/09 |
| | | | | 455/116 |
| 10,852,437 B2 * | 12/2020 | Eken | ........................ | H03F 1/32 |
| 11,522,455 B2 * | 12/2022 | Nam | ........................ | H02M 1/32 |
| 2018/0131336 A1 * | 5/2018 | Kwak | ................... | H03F 1/0233 |

\* cited by examiner

*Primary Examiner* — Patricia T Nguyen
(74) *Attorney, Agent, or Firm* — Mandy Barsilai Fernandez; Frank D. Cimino

(57) ABSTRACT

A device comprises a voltage limiter, two capacitors, a resistor, and a voltage follower buffer. The voltage limiter has a first input coupled to a reference voltage rail, a second input coupled to a supply voltage rail, and two voltage limiter outputs. The first capacitor is coupled between a device output and the first voltage limiter output, and the resistor is coupled between the first and second voltage limiter outputs. The voltage follower buffer has an input coupled to the first voltage limiter output and a voltage follower buffer output. The second capacitor is coupled between a device input and the voltage follower buffer output. In some implementations, a resistance of the resistor is greater than a capacitance of the first capacitor. In some implementations, a third capacitor is coupled between the device input and the device output.

21 Claims, 2 Drawing Sheets

NONLINEAR FREQUENCY COMPENSATION SYSTEM

BACKGROUND

A transconductance amplifier (also referred to as a transconductor) is similar to an operational amplifier. However, the transconductor outputs a current as a function of the difference of two input voltages.

Miller frequency compensation is a technique to stabilize, for example, an amplifier (such as an operational amplifier or a transconductor) using a capacitor coupled across a gain stage in the amplifier to provide negative feedback. However, for high-voltage power supplies such as 40 volts (V) or greater, the area of the integrated circuit occupied by the Miller compensation capacitor increases. In addition, the value of the Miller compensation capacitor limits the slewing rate of the amplifier.

SUMMARY

A device comprises a voltage limiter, two capacitors, a resistor, and a voltage follower buffer. The voltage limiter has a first input coupled to a reference voltage rail, a second input coupled to a supply voltage rail, and two voltage limiter outputs. The first capacitor is coupled between a device output and the first voltage limiter output, and the resistor is coupled between the first and second voltage limiter outputs. The voltage follower buffer has an input coupled to the first voltage limiter output and a voltage follower buffer output. The second capacitor is coupled between a device input and the voltage follower buffer output.

In some implementations, the reference voltage rail is a positive supply voltage rail and the supply voltage rail is a negative supply voltage rail. The voltage at the reference voltage rail determines a voltage limit across the resistor. In some implementations, the second voltage limiter output is further coupled to the supply voltage rail. The resistance of the resistor is greater than a capacitance of the first capacitor in some implementations. A third capacitor can be coupled between the device output and the device input.

In some implementations, the device is incorporated into an amplifier with two transconductors. The first transconductor has an input for an input signal and an output, and the second transconductor has an input coupled to the output of the first transconductor and an output. The device is coupled across the input and the output of the second transconductor. A ratio of the capacitance of the first capacitor and the capacitance of the second capacitor can determine the settling time of the amplifier.

BRIEF DESCRIPTION OF THE DRAWINGS

For a detailed description of various examples, reference will now be made to the accompanying drawings in which.

The same reference numbers or other reference designators are used in the drawings for the same or similar (either by function and/or structure) features.

DETAILED DESCRIPTION

The frequency compensation stage described herein includes a high-frequency filter comprising a first capacitor and a resistor, a voltage limiter, a voltage follower, and a second capacitor. The first capacitor is coupled between the output of the frequency compensation stage and the resistor. The resistor is further coupled to a supply voltage. The voltage limiter limits the voltage swing across the resistor, for example between positive or negative 100 millivolts (mV) and 1 Volt (V). The voltage follower has an input coupled between the first capacitor and the resistor, and an output coupled to the second capacitor. The second capacitor is further coupled to an input of the frequency compensation stage.

Figure 1A:
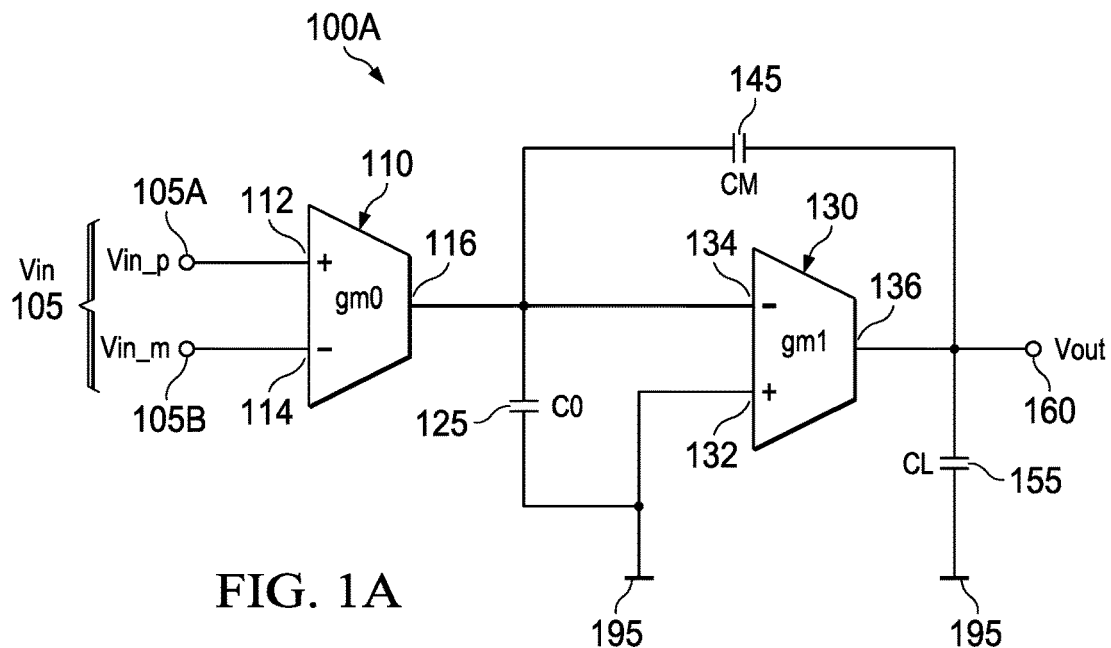
FIG. 1A shows a block diagram of an example two-stage amplifier with a Miller compensation capacitor.

FIG. 1A shows a block diagram of an example two-stage amplifier 100A with a Miller compensation capacitor Cm 145. The amplifier 100A includes a first transconductor 110, a second transconductor 130, a capacitor C0 125 (that represents the parasitic capacitance of the second transconductor 130), the Miller compensation capacitor Cm 145, and a capacitor CL 155 (that represents the load capacitance on the output of the amplifier 100A). The first transconductor 110 has a gain gm0. First transconductor 110 includes a positive input 112 ("+") (configured to receive a positive input signal Vin_p 105A of the differential input signal Vin 105) and a negative input 114 ("−") (configured to receive a negative input signal Vin_m 105B of Vin 105). The first transconductor 110 has an output 116. Input signal Vin 105 may be a differential signal.

The negative input 134 of the second transconductor 130 is coupled to the output 116 of the first transconductor 110, and the positive input 132 of the second transconductor 130 is coupled to a common potential (e.g., ground or a supply voltage, such as a negative supply voltage) 195. The second transconductor 130 has a gain gm1 and an output 136 which provides the output voltage Vout 160. The capacitor C0 125 is coupled between the negative input 134 of the second transconductor 130 and the common potential 195, and the capacitor Cm 145 is coupled between the negative input 134 of the second transconductor 130 and the output 136 of the second transconductor 130. The load capacitor CL 155 is coupled between the output (Vout) and the common potential 195.

Figure 1B:
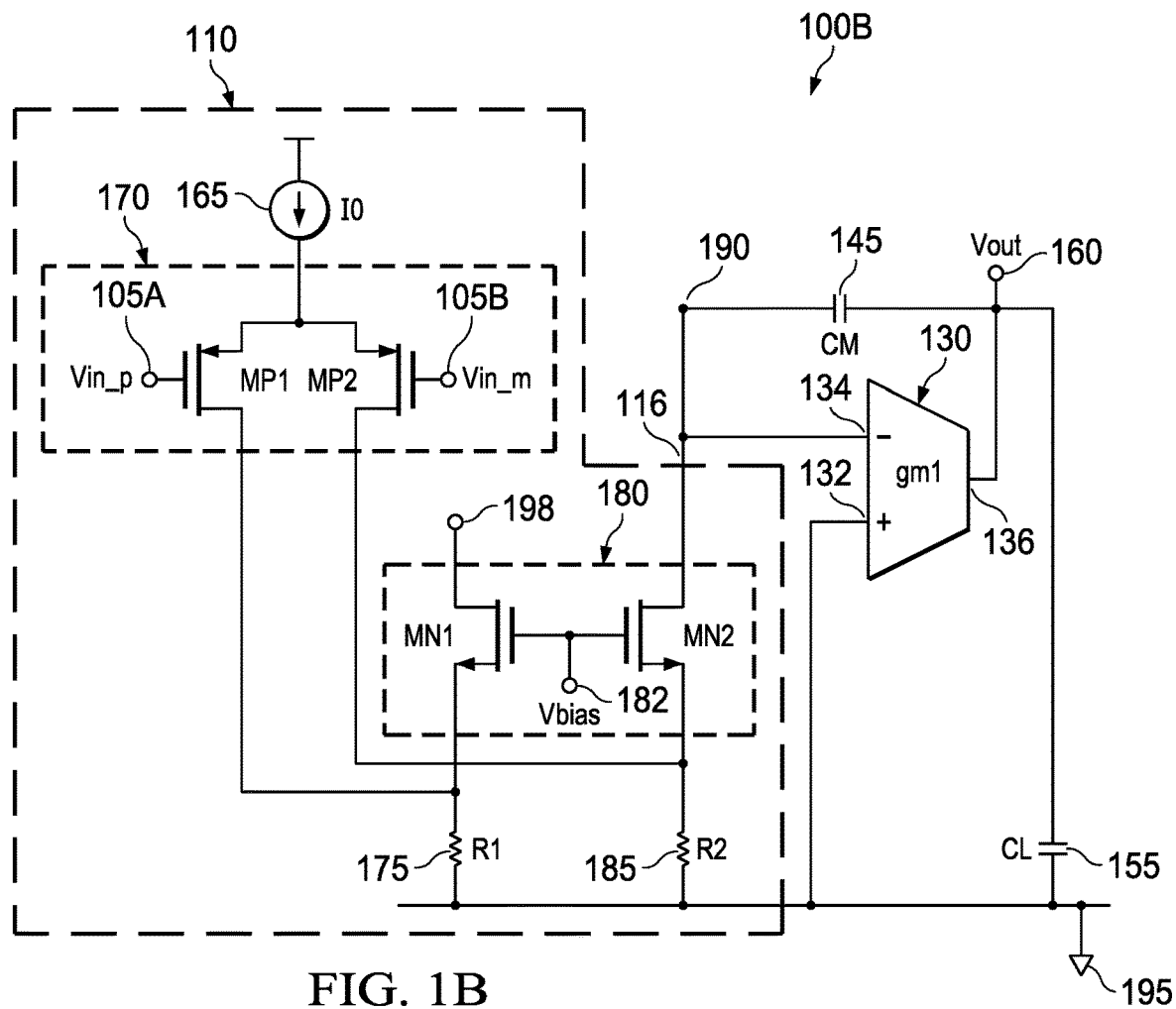
FIG. 1B shows an example implementation of the two-stage amplifier shown in FIG. 1A.

FIG. 1B shows an example implementation 100B of the two-stage amplifier 100A shown in FIG. 1A. The first transconductor 110 includes the first differential pair 170, the second differential pair 180, resistors R1 175 and R2 185, and a current source I0 165 ("I0" may be referred to herein as the current source device itself as well as the magnitude of the current it produces). The first differential pair 170 includes transistors MP1 and MP2, and the second differential pair 180 includes transistors MN1 and MN2. In this example, the transistors MP1 and MP2 and MN1 and MN2 are metal oxide semiconductor field-effect transistors (MOSFETs). MP1 and MP2 are p-type MOSFETs (PFETs), and MN1 and MN2 are n-type MOSFETS (NFETs) in this example.

In other examples, one or more of MP1 and MP2 are NFETs, one or more of MN1 and MN2 are PFETs, or one or more of MP1, MP2, MN1, and MN2 are bipolar junction transistors (BJTs). A BJT includes a base corresponding to the gate terminal, and a collector and an emitter corresponding to the drain and source terminals of a MOSFET. The base of a BJT and the gate terminal of a MOSFET are referred to herein as control inputs. The collector and emitter of a BJT and the drain and source terminals of a MOSFET are referred to herein as current terminals.

The current source I0 165 is configured to provide a tail current to the input differential pair 170 formed by MP1 and MP2. In the first differential pair 170, the source terminals of MP1 and MP2 are coupled together and collectively configured to receive the current I0 165. The gate terminal of MP1 is configured to receive the positive input signal Vin_p 105A, and the gate terminal of MP2 is configured to receive the negative input signal Vin_m 105B. The drain terminal of MP1 is coupled to the source terminal of MN1 and the resistor R1 175. The drain terminal of MP2 is coupled to the source terminal of MN2 and the resistor R2 185. The second differential pair 180 includes the transistors MN1 and MN2. The drain terminal of MN1 is coupled to an input 198, which may be coupled to a current source, or another component. The resistor R1 175 is coupled between the source terminal of MN1 and the common potential 195.

The drain terminal of MN2 is coupled to the output 116 of the first transconductor 110. The output 116 may be coupled to an input 190, which may be further coupled to a current source, or another component. The resistor R2 185 is coupled between the source terminal of MN2 and the common potential 195. The gate terminals of MN1 and MN2 are coupled together and receive a biasing voltage Vbias 182 such that MN1 and MN2 remain turned on. The biasing voltage Vbias 182 may be provided by the input 198, a current source such as current source 165, or any appropriate biasing circuit. In the second transconductor 130, the negative input 134 is coupled to the input 190, and the positive input 132 is coupled to the common potential 195. The output 136 of the second transconductor 130 provides the output voltage Vout 160. The capacitor Cm 145 is coupled between the negative input 134 and the output 136 of the second transconductor 130. The load capacitor CL 155 is coupled between the output 136 of the second transconductor 130 and common potential 195.

The compensation capacitor Cm 145 provides negative feedback and splits the poles in the transfer function of amplifier 100 (which collectively or individually refers to amplifiers 100A and/or 100B). By splitting the poles, the compensation capacitor Cm 145 creates a dominant pole such that the transfer function of amplifier 100 is a first order transfer function over a large range of frequencies, thereby increasing the stability of the amplifier 100. The compensation capacitor Cm 145 is able to provide sufficient frequency compensation, but for high voltage supplies, such as 40V or greater, the area occupied by the capacitor Cm 145 increases greatly. For example, high-voltage operational amplifiers use extended-drain metal oxide semiconductor transistors with low-voltage oxides and a larger parasitic capacitance value per unit area. In some embodiments, the smallest possible value of the compensation capacitor Cm 145 should be greater than the parasitic gate capacitance of the output stage in the operational amplifier. Hence, the increased parasitic capacitance of the extended-drain metal oxide semiconductor transistors with low-voltage oxides also increases the area occupied by the compensation capacitor Cm 145. For example, the area of the compensation capacitor Cm 145 can be three to five times the area of the transistors of the output stage.

In addition, the slew rate of the amplifier 100 is limited by the change in voltage over time. The slew rate may be represented as:

$$\frac{dVout}{dt} = \frac{I0\ 165}{Cm\ 145}$$

As such, for higher values of the compensation capacitor Cm, the slew rate of the output voltage is reduced, which means that Vout may not be able change as fast as the rate of change of the differential input voltage (Vin_p-Vin_m).

Figure 2A:
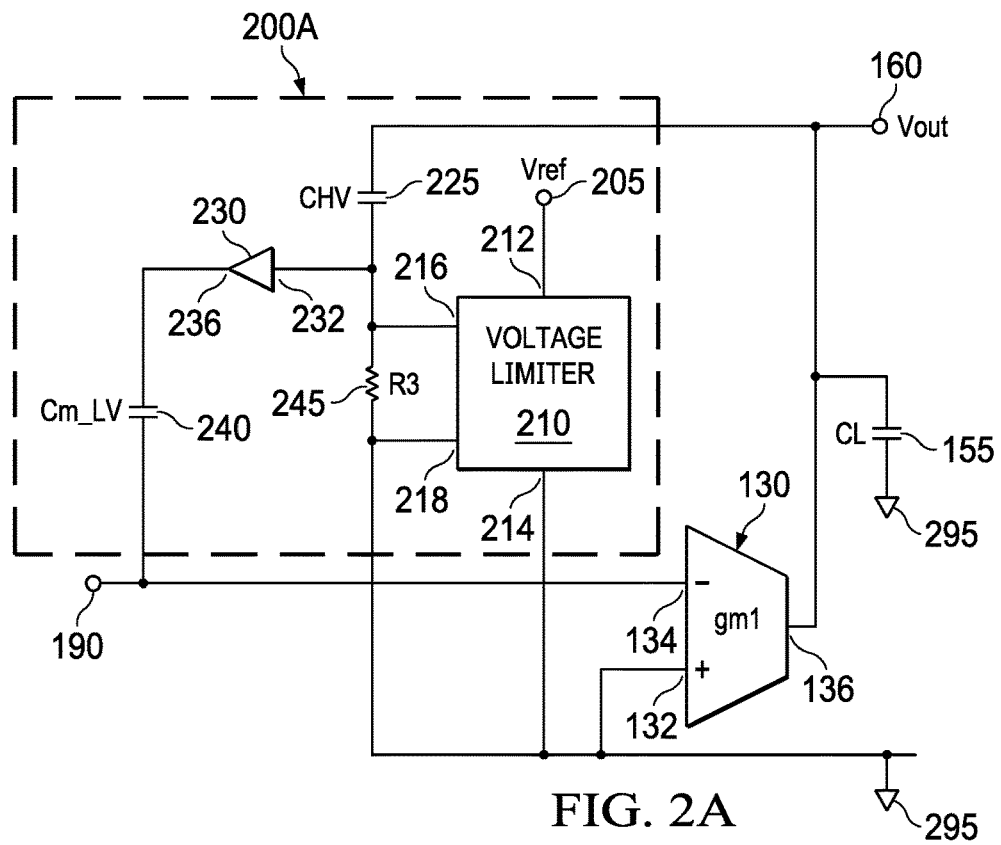
FIG. 2A shows an example nonlinear Miller compensation stage for a two-stage amplifier.

FIG. 2A shows an example nonlinear Miller compensation stage 200A for an amplifier such as the two-stage amplifiers shown in FIGS. 1A-B. The nonlinear Miller compensation stage 200A can be used in place of the compensation capacitor Cm 145 shown in FIGS. 1A-B and is shown with the load capacitor CL 155 and the second transconductor 130 of the two-stage amplifier 100. The nonlinear Miller compensation stage 200A includes a voltage limiter 210, a first capacitor CHV 225, a Miller compensation capacitor Cm_LV 240, a voltage follower buffer 230, and a resistor 245.

In this example, the voltage limiter 210 has a first input 212 configured to receive a reference voltage Vref 205 and a second input 214 coupled to the common mode potential 295 (which may be the same as or similar to common potential 195 in some examples). The resistor R3 245 is coupled between a first output 216 and a second output 218 of the voltage limiter 210. The voltage limiter 210 limits the voltage swing across the resistor R3 245 based on the reference voltage Vref 205 (e.g., a voltage between approximately positive or negative 100 mV and approximately 1V). The value of Vref 205 can be chosen based on the desired voltage swing across the resistor R3 245. The capacitor CHV 225 is coupled between the output Vout 160 and the resistor R3 245. The resistor R3 245 is coupled between the outputs 216 and 218 of the voltage limiter 210 and to the common mode potential 295.

The resistance value of the resistor R3 245 may be relatively large, for example approximately five Gigaohms (GΩs), and the capacitance value of the capacitor CHV 225 may be relatively small, for example approximately 0.2 picoFarads (pFs). The resistor R3 245 and the capacitor CHV 225 act as a high-frequency filter. The input 232 of the voltage follower buffer 230 is coupled between the resistor R3 245 and the capacitor CHV 225. The capacitor Cm_LV 240 is coupled between the output 236 of the voltage follower buffer 230 and the input 190, to which the negative input 134 of the second transconductor 130 is coupled as shown and to which the output 116 of the first transconductor 110 may be coupled as shown in FIG. 1A.

The voltage limiter 210 causes the voltage across the resistor R3 245 to remain relatively fixed based on the reference voltage Vref 205, for example 0.7V in this implementation. The voltage limiter 210 may be implemented using diodes, operational amplifiers, transistors, or any other appropriate voltage limiting technique. In one example, voltage limiter 210 may be implemented using a pFET and an nFET, where the gates of the nFET and the pFET and the drain of the pFET are connected to the common potential 295 and the sources of the nFET and the pFET are connected to output 216. In this example, voltage limiter 210 receives Vref 205 and is coupled to the common potential 295, but in other implementations, the voltage limiter 210 does not receive a reference voltage, or the common potential 295, or both. While the amplifier including the nonlinear Miller compensation stage 200A operates in a linear mode of operation, the output voltage Vout 160 and the voltage at the input 232 of the voltage follower buffer 230 remain substantially constant. While the output voltage Vout 160 increases and decreases rapidly such as while slewing, the voltage limiter 210 limits the voltage across the resistor R3 245 to approximately 0.7V in this example.

The output voltage Vout 160 drives the input 232 of the voltage follower buffer 230 through the capacitor CHV 225, and the voltage follower buffer 230 provides a voltage to the low voltage Miller capacitor Cm_LV 240. A threshold frequency ($f_{th}$) can be chosen equal to a bandwidth of the amplifier divided by 1000, for example, and can be represented as:

$$f_{th} = \frac{1}{2\pi(R3\ 245)(CHV\ 225)}$$

At frequencies above the threshold frequency, the output 236 of the voltage follower buffer 230 is substantially the same as the output voltage Vout 160, and the nonlinear Miller compensation stage 200A operates as a typical Miller compensation stage, with capacitor Cm_LV 240 providing the Miller compensation for the amplifier. In an example where an amplifier has a 10 MegaHerz (MHz) bandwidth, at frequencies above 10 kiloHerz (kHz), the output 236 of the voltage follower buffer 230 is substantially the same as the output voltage Vout 160.

While the voltage at the input 190 is slewing, the voltage provided to the input 232 of the voltage follower buffer 230 is limited by the voltage clamp 210, and, because it is not necessary to charge the capacitor Cm_LV 240, the nonlinear Miller compensation stage 200A allows the output voltage Vout 160 to slew much faster than the Miller compensation circuitry shown in FIGS. 1A-B. The time constant based on the capacitance CHV 225 times the resistance of R3 245 creates a pole-zero doublet in the transfer function of the two-stage amplifier. Accordingly, the capacitance value of CHV 225 and the resistance value of R3 245 can be chosen such that the resulting time constant is at relatively low frequencies, for example, at least 1,000 times below the amplifier bandwidth.

Figure 2B:
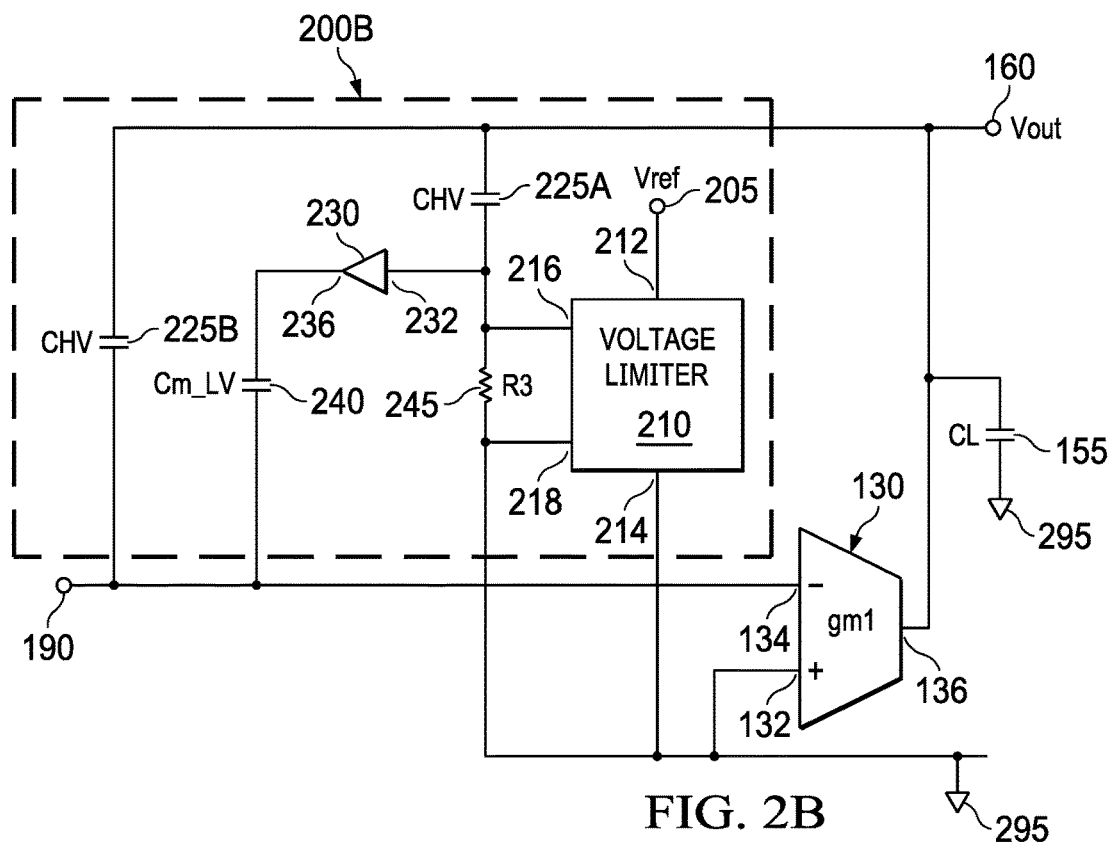
FIG. 2B shows another example nonlinear Miller compensation stage for a two-stage amplifier.

FIG. 2B shows another example nonlinear Miller compensation stage 200B for a two-stage amplifier. The nonlinear Miller compensation stage 200B is similar to the nonlinear Miller compensation stage 200A shown in FIG. 2A, but the capacitor CHV 225 is divided into a first capacitor CHV 225A coupled between the resistor R3 245 and the output Vout 160, and a second capacitor CHV 225B between the input 190 and the output Vout 160. The nonlinear Miller compensation stage 200B can be used in place of the compensation capacitor Cm 145 shown in FIGS. 1A-B and is shown with the load capacitor CL 155 and the second transconductor 130 of the two-stage amplifier 100.

The nonlinear Miller compensation stage 200B includes a voltage limiter 210, a first capacitor CHV 225A, a second capacitor CHV 225B, a Miller compensation capacitor Cm_LV 240, a voltage follower buffer 230, and a resistor R3 245. In this example, the voltage limiter 210 has a first input 212 configured to receive a reference voltage Vref 205. A second input 214 is coupled to the common mode potential 295. The resistor R3 245 is coupled between a first output 216 and a second output 218 of the voltage limiter 210. The voltage limiter 210 limits the voltage swing across the resistor R3 245 based on the reference voltage Vref 205, for example between positive or negative 100 mV and 1V. The value of Vref 205 can be chosen based on the desired voltage swing across the resistor R3 245. The capacitor CHV 225A is coupled between the output Vout 160 and the resistor R3 245. The resistor R3 245 is coupled between the outputs 216 and 218 of the voltage limiter 210 and to the common mode potential 295. The resistor R3 245 and the capacitor CHV 225A act as a high-frequency filter. The input 232 of the voltage follower buffer 230 is coupled between the resistor R3 245 and the capacitor CHV 225A. The capacitor Cm_LV 240 is coupled between the output 236 of the voltage follower buffer 230 and the input 190, to which the negative input 134 of the second transconductor 130 is coupled as shown and to which the output 116 of the first transconductor 110 may be coupled as shown in FIG. 1A.

The capacitor CHV 225B is coupled between the input 190 and the output Vout 160. The voltage limiter 210 causes the voltage across the resistor R3 245 to remain relatively fixed at approximately +0.7V in this implementation. The output voltage Vout 160 drives the input 232 of the voltage follower buffer 230 through the capacitor CHV 225A, and the voltage follower buffer 230 provides a voltage on to the low voltage Miller capacitor Cm_LV 235. A threshold frequency can be chosen equal to a bandwidth of the amplifier divided by 1000, for example, and can be represented as:

$$f_{th} = \frac{1}{2\pi(R3\ 245)(CHV\ 225A)}$$

At frequencies above the threshold frequency, the output 236 of the voltage follower buffer 230 is substantially the same as the output voltage Vout 160, and the nonlinear Miller compensation stage 200B operates as a typical Miller compensation stage, with capacitor Cm_LV 240 providing the Miller compensation for the amplifier. For example, if an amplifier has a 10 MegaHerz (MHz) bandwidth, the output 236 of the voltage follower buffer 230 is substantially the same as the output voltage Vout 160, at frequencies above 10 kiloHerz (kHz).

While the input voltage at the input 190 is slewing, the voltage provided to the input 232 of the voltage follower buffer 230 is limited by the voltage limiter 210, and because it is not necessary to charge the capacitor Cm_LV 240, the nonlinear Miller compensation stage 200B allows the output voltage Vout 160 to slew much faster than the Miller compensation capacitor Cm 145 shown in FIGS. 1A-B. The time constant based on the capacitance CHV 225A times the resistance of R3 245 creates a pole-zero doublet in the transfer function of the two-stage amplifier. Accordingly, the capacitance value of CHV 225A and the resistance value of R3 245 can be chosen such that the resulting time constant is at relatively low frequencies, for example, at least 1,000 times below the amplifier bandwidth.

Dividing the capacitor CHV 225 shown in FIG. 2A into two capacitors CHV 225A and 225B with the same total value allows the slew rate for large signals to be determined based on the capacitance of CHV 225B. The capacitor CHV 225B is charged by a current equal to the capacitance of CHV 225B times the derivative of the output voltage Vout 160 over time, setting the slew rate for large signals proportional to the capacitance of CHV 225B. The current used to charge the capacitor CHV 225B is limited by the tail current I0 165 of the first transconductor 110, and so the derivative of the output voltage Vout 160 over time is also limited.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

Modifications are possible in the described embodiments, and other embodiments are possible, within the scope of the claims.

What is claimed is:

1. A device, comprising:
    a voltage limiter having a first input coupled to a reference voltage rail, a second input coupled to a supply voltage rail, a first voltage limiter output, and a second voltage limiter output;
    a first capacitor coupled between a device output and the first voltage limiter output;
    a resistor coupled between the first voltage limiter output and the second voltage limiter output;
    a voltage follower buffer having an input coupled to the first voltage limiter output and having a voltage follower buffer output; and
    a second capacitor coupled between a device input and the voltage follower buffer output.

2. The device of claim 1, wherein the reference voltage rail is a positive supply voltage rail and the supply voltage rail is a negative supply voltage rail.

3. The device of claim 1, wherein a voltage at the reference voltage rail determines a voltage limit across the resistor.

4. The device of claim 1, wherein the second voltage limiter output is further coupled to the supply voltage rail.

5. The device of claim 1, wherein a resistance of the resistor is greater than a capacitance of the first capacitor.

6. The device of claim 1, further comprising a third capacitor coupled between the device output and the device input.

7. An apparatus, comprising:
    a first capacitor having a first terminal coupled to an output of the apparatus and a second terminal;
    a resistor having a first terminal coupled to the second terminal of the first capacitor and a second terminal coupled to a supply voltage rail;

a voltage limiter coupled to a reference voltage rail and to the supply voltage rail, wherein the voltage limiter is configured to maintain a voltage across the resistor;

a voltage follower buffer having a voltage follower buffer input and a voltage follower buffer output, wherein the voltage follower buffer input is coupled to the second terminal of the first capacitor and the first terminal of the resistor; and a second capacitor having a first terminal coupled to the voltage follower buffer output and a second terminal coupled to an input of the apparatus.

8. The apparatus of claim 7, wherein the supply voltage rail is a negative supply voltage rail and the reference voltage rail is a positive supply voltage rail.

9. The apparatus of claim 7, wherein a voltage at the reference voltage rail determines the voltage across the resistor.

10. The apparatus of claim 7, wherein a resistance of the resistor is greater than a capacitance of the first capacitor.

11. The apparatus of claim 7, further comprising an amplifier, wherein the amplifier comprises:
   a first transconductor having an input configured to receive an input signal and an output; and
   a second transconductor having an input coupled to the output of the first transconductor and an output coupled to the output of the apparatus wherein the input of the apparatus is coupled to the output of the first transconductor.

12. The apparatus of claim 11, wherein a ratio of a capacitance of the first capacitor and a capacitance of the second capacitor determines a settling time of the amplifier.

13. A frequency compensation apparatus, comprising:
   a high-frequency filter coupled between an output and a supply voltage rail;
   a voltage limiter configured to maintain a voltage across at least a portion of the high-frequency filter;
   a voltage follower buffer coupled to the high-frequency filter; and
   a compensation capacitor configured to load an output of the voltage follower buffer.

14. The frequency compensation apparatus of claim 13, wherein the compensation capacitor is a first capacitor, and wherein the high-frequency filter comprises:
   a second capacitor coupled to the output; and
   a resistor coupled between the second capacitor and the supply voltage rail.

15. The frequency compensation apparatus of claim 14, wherein a resistance of the resistor is greater than a capacitance of the second capacitor.

16. The frequency compensation apparatus of claim 14, wherein the voltage limiter is configured to maintain the voltage across the resistor.

17. The frequency compensation apparatus of claim 16, wherein:
   the voltage limiter comprises a first input coupled to a reference voltage rail, a second input coupled to the supply voltage rail, a first output, and a second output;
   the resistor is coupled between the first and second outputs; and
   a voltage at the reference voltage rail determines the voltage across the resistor.

18. The frequency compensation apparatus of claim 17, wherein the supply voltage rail is a negative supply voltage rail and the reference voltage rail is a positive supply voltage rail.

19. The frequency compensation apparatus of claim 14, further comprising an amplifier, wherein the amplifier comprises:
   a first transconductor having an input configured to receive an input signal and an output; and
   a second transconductor having an input coupled to the output of the first transconductor and an output coupled to the output, wherein an input of the frequency compensation apparatus is coupled to the output of the first transconductor.

20. The frequency compensation apparatus of claim 19, wherein a ratio of a capacitance of the compensation capacitor and a capacitance of the second capacitor determine a settling time of the amplifier.

21. The frequency compensation apparatus of claim 13, wherein the compensation capacitor is a first capacitor, and wherein the frequency compensation apparatus further comprises a second capacitor coupled between the output and the compensation capacitor.

* * * * *